United States Patent
Adachi et al.

[11] Patent Number: 6,129,787
[45] Date of Patent: Oct. 10, 2000

[54] SEMICONDUCTOR SILICON WAFER, SEMICONDUCTOR SILICON WAFER FABRICATION METHOD AND ANNEALING EQUIPMENT

[75] Inventors: Naoshi Adachi, Ogimachi; Masakazu Sano; Shinsuke Sadamitsu, both of Saga; Tsuyoshi Kubota, Kouhokumachi, all of Japan

[73] Assignee: Sumitomo Metal Industries, Ltd., Osaka, Japan

[21] Appl. No.: 09/212,389

[22] Filed: Dec. 16, 1998

[30] Foreign Application Priority Data

Jan. 6, 1998 [JP] Japan ................................. 10-013346
Mar. 27, 1998 [JP] Japan ................................. 10-100052

[51] Int. Cl.$^7$ ................................................. C30B 25/02
[52] U.S. Cl. ................................. 117/89; 117/93; 117/97; 117/102
[58] Field of Search ................................. 117/89, 93, 97, 117/102; 438/143, 402

[56] References Cited

U.S. PATENT DOCUMENTS 5,931,662  8/1999  Adachi et al. ........................... 432/6

*Primary Examiner*—Felisa Hiteshew
*Attorney, Agent, or Firm*—Breiner & Breiner

[57] ABSTRACT

An object of the present invention is to provide a single-crystal silicon wafer where octahedral voids of Grown-in defects, which are the generation source of COP on the surface and COP at several $\mu$m depth of the surface layer of the single-crystal silicon wafer grown by the CZ method, are effectively eliminated, and a fabrication method of this wafer, where oxygen near the surface is out-diffused by annealing in a hydrogen and/or inactive gas ambient and oxide film on the inner walls of the octahedral voids near the surface are removed by the created unsaturated oxygen area, then oxidation annealing is performed in an oxygen ambient or mixed gas ambient of oxygen and inactive gas, so that interstitial silicon atoms are forcibly injected to completely eliminate the octahedral voids near the surface, and at the same time an IG layer is created in the bulk of the wafer.

24 Claims, 4 Drawing Sheets

SEMICONDUCTOR SILICON WAFER, SEMICONDUCTOR SILICON WAFER FABRICATION METHOD AND ANNEALING EQUIPMENT

FIELD OF THE INVENTION

The present invention relates to a single-crystal silicon wafer where Grown-in defects to be the source of COP (Crystal Originated Particle) on the surface and COP at a several $\mu$m depth from the surface layer of the wafer, and more particularly to a semiconductor silicon wafer and its fabrication method which allow a low temperature annealing that implements a lower cost than the conventional method, characterized in that residue of Grown-in defects near the surface caused by annealing in a hydrogen and/or inactive gas is annealed in oxygen alone, or in a mixed gas of oxygen and inactive gas or in a hydrogen ambient combining with water vapor, so that interstitial silicon atoms are forcibly injected from the wafer surface, Grown-in defects near the surface are completely eliminated by being efficiently filled with the interstitial silicon atoms, and device characteristics are improved.

DESCRIPTION OF THE PRIOR ART

Single-crystal silicon substrates used for fabrication of semiconductor devices are now fabricated mainly by the Czochralski method (CZ method). In the highly advanced integration of device processes today, it is clear that low concentration Grown-in defects generated during crystal growth, which have never been a problem before, now influence the characteristics of the device.

The Grown-in defect in a crystal is one or a plurality of connected octahedral voids, and if the Grown-in defect is exposed on the surface after the crystal is processed in a state of a wafer, the voids become square pyramidal pits. In other words, when the crystal ingots are sliced into wafers, and the wafers are mirror-polished and cleaned, defective pits which appear on the surface of the wafers, that is, COPs, influence gate oxide film integrity.

Conventionally Grown-in defects were decreased by performing slow cooling when a single-crystal is grown by the CZ method, but at the same time this increases defect size. Now device patterns have become much finer, and Grown-in defect sizes are no longer ignored compared to pattern size, and wafers completely free from Grown-in defects are demanded in the device area.

Therefore in the latest mass production 64 M DRAM process, epitaxial wafers free from Grown-in defects, or hydrogen-argon annealed wafers which have the effect to eliminate Grown-in defects near the surface, are used.

However, the cost of epitaxial wafers is high, and in hydrogen or argon annealed wafers, Grown-in defects only on the wafer surface are completely eliminated, but Grown-in defects in layers near the surface remain without being completely eliminated.

It is known that the inner walls of Grown-in defects are covered with oxide films immediately after crystal growth, and that the oxide films on the inner walls must be dissolved to eliminate the Grown-in defects.

It is true that high temperature annealing in hydrogen, inactive gas, or in a mixture of these gases cause an out-diffusion of oxygen near the surface, dissolves the oxide films on the inner walls of the Grown-in defects near the surface since oxygen is unsaturated, and Grown-in defects are eliminated by interstitial silicon atoms supplied by the thermal equilibrium state.

However, in the above mentioned high temperature annealing, many residues of Grown-in defects remain even at locations a 1 $\mu$m depth from the wafer surface, and this imperfect surface active area affects device yield.

As a method for efficiently eliminating Grown-in defects, annealing wafers at 1300° C. or higher temperatures is being considered, but this method has not yet been commercialized because of the load on the heat treatment furnace, slip problems caused by deterioration of mechanical strength of wafers and heavy metal metal contamination problems, and because of other problems.

Recently a method for removing oxide films on the inner walls of Grown-in defects by 10~20 second RTA (Rapid Thermal Annealing) in a hydrogen ambient, and eliminating Grown-in defects by interstitial silicon atoms supplied from the wafer surface at thermal equilibrium concentration is being proposed (Takao Abe et al: The 31st VLSI Ultra Clean Technology Symposium Reports: USC Semiconductor Fundamental Technology Workshop, Dec. 18,19, 1997).

With the above mentioned hydrogen reduction RTA method, it may be difficult to grow oxide films on the inner walls when the temperature is rising because of rapid temperature rising and annealing for a short time, but this is basically the same as generally performed hydrogen annealing. In other words, in the above mentioned method, crystals pulled at high-speed by the CZ method are necessary since small Grown-in defects must be generated as a prerequisite, and crystals with an extremely low oxygen concentration are necessary to decrease the thickness of oxide films on the inner walls of the Grown-in defects.

Also in the case of the hydrogen reduction RTA method, which implements rapid temperature rising by RTA using extremely low oxygen concentration crystals, the problems are that the growth of oxygen precipitates cannot be expected at all in annealing thereafter, and the IG (Intrinsic Gettering) effect against heavy metal contamination in device processing cannot be expected.

Also in the case of the hydrogen reduction RTA method which targets single-crystal wafers with extremely low oxygen concentration pulled at high-speed by the CZ method, the depth of a perfect area to be generated is approximately 0.2 $\mu$m from the surface, and improving wafers in such an area contributes little to the improvement of yield in device processes.

SUMMARY OF THE INVENTION

In a wafer sliced from a single-crystal silicon grown by the CZ method, it is an object of the present invention to provide a solution for efficiently eliminating octahedral voids of Grown-in defects, which are the generation source of COP on the wafer surface and COP on the surface layer at a several pm depth from the surface, and it is another object to provide a single-crystal silicon wafer where defects on and near the wafer surface are completely eliminated using a conventional method of high temperature annealing in a hydrogen and inactive gas ambient, it is another object to provide a method for fabricating these wafers, and it is sill another object to provide annealing equipment used for the above mentioned fabrication method.

The inventors studied annealing that can effectively eliminate octahedral voids of Grown-in defects on and near the wafer surface in various ways, using a method of high temperature annealing in a hydrogen gas and/or inactive gas ambient, and as a result, the inventors discovered that annealing in a hydrogen and/or inactive gas ambient will remove oxide films on the inner walls of octahedral voids (Grown-in defects) near the wafer surface, interstitial silicon atoms are injected by an oxidation annealing performed after the above mentioned annealing, a semiconductor silicon wafer completely free from void defects near the wafer surface is obtained, and complete elimination of Grown-in defects, which is an objective, can be implemented.

In other words, the inventors completed this invention discovering that in a silicon wafer fabrication process, if a semiconductor silicon wafer obtained from single-crystal silicon by an ordinary CZ method is annealed in a hydrogen and/or inactive gas ambient to remove oxide films on the inner walls of the octahedral voids near the surface by causing the out-diffusion of oxygen near the surface and creating an unsaturated area of oxygen, and oxidation annealing is then performed in oxygen gas alone, or in a mixed gas ambient of oxygen and inactive gas, then interstitial silicon atoms can be forcibly injected, octahedral voids near the surface can be completely eliminated, and an IG layer can be formed in the bulk of the wafer at the same time, and that the perfection of the obtained wafer surface is as good as an epitaxial wafer, and this wafer can be fabricated at less cost than an epitaxial wafer.

The inventors also discovered that if such an inactive gas ambients, such as argon and helium, are used for annealing in the silicon wafer fabrication process in accordance with the present invention method, it is possible to replace these gas ambients with an oxygen ambient or to shift to a mixed gas ambient of oxygen and inactive gas while maintaining the temperature or increasing or decreasing temperature for the next oxidation annealing after the first high temperature annealing ends.

The inventors also discovered that wafers to be used in the annealing of the present invention may be mirror-polished final wafers, or if a heating treatment furnace which generates pits during annealing in an argon ambient is used, it is possible to use roughly polished wafers before final polishing and to perform final mirror polishing after the annealing, and that a method of using wafers where slight thermal oxide film is grown before performing the annealing of this invention so that the thermal oxide film protects in the temperature range where pits are generated can be jointly used.

The inventors paid attention to the ease of applying the annealing of the present invention since a conventional heat treatment furnace using an ambient containing hydrogen has an air tight structure for the furnace entry because if oxygen enters from air into the furnace, an explosion may occur, however the inventors discovered that in the case of an ordinary diffusion furnace where some oxygen and moisture enters from air, an oxide films grow on the wafer surface during the first annealing of this invention and an out-diffusion of oxygen becomes insufficient, therefore oxide films on the inner walls of the Grown-in defects grow, and the oxide films on the inner walls of the Grown-in defects completely fill the voids in the next oxidation annealing.

The inventors discovered that the annealing in accordance with the present invention can be performed even in the above mentioned ordinary diffusion furnace type heat treatment furnace if a simple modified structure where a gas purge structure and a furnace insertion buffer are used at a cap of the furnace entry to prevent oxygen and moisture in the air from mixing in during annealing, and completed this invention.

DESCRIPTION OF THE PREFERRED EMBODIMENTS

Figure 1:
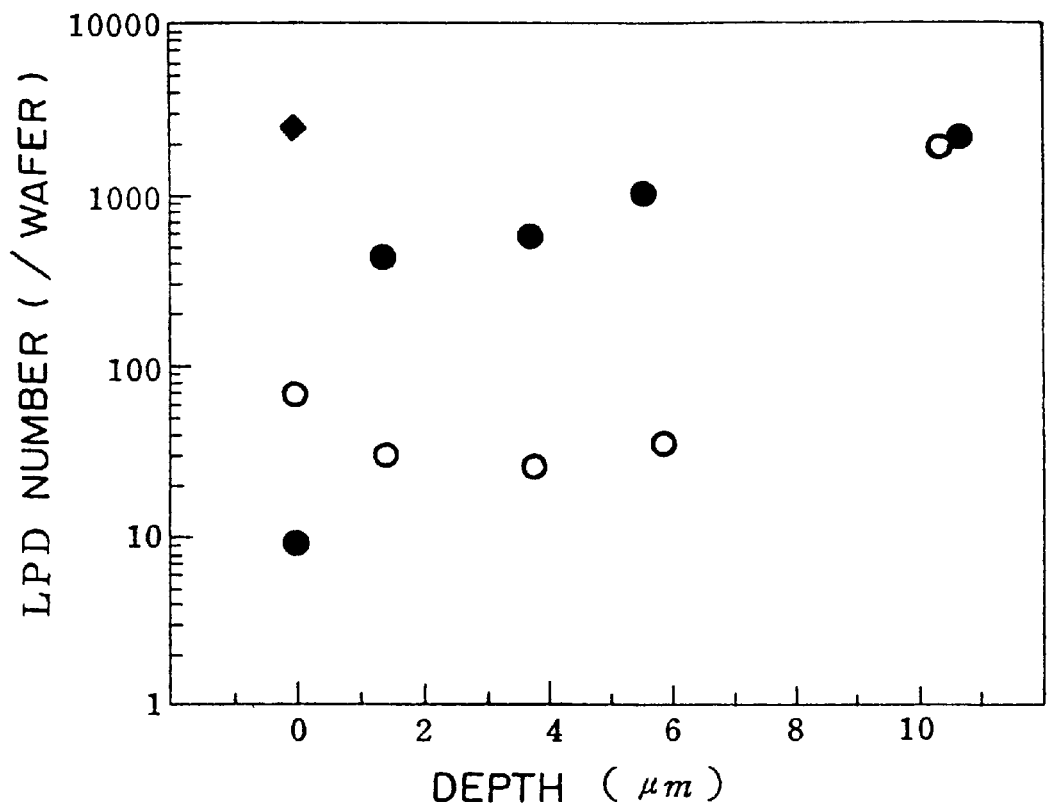
FIG. 1 is a graph depicting a relationship between depth from the surface of a semiconductor silicon wafer and a number of LPDs (Light Point Defects)

An object of this invention is to completely eliminate Grown-in defects remaining after the oxide films on the inner walls of octahedral voids are removed by high temperature annealing in a hydrogen and/or inactive gas ambient, and if a wafer is annealed by hydrogen or inactive gas or in their mixed gases, Grown-in defects near the surface are removed but decreased sized voids remain after the oxide films on the inner voids dissolve, even in areas that are 1 $\mu$m deep from the surface.

So in this invention, the oxide films on the inner walls of Grown-in defects are removed by the high temperature annealing using a hydrogen and/or inactive gas ambient first, then interstitial silicon atoms are forcibly injected by annealing in oxygen gas alone or in a mixed gas ambient of oxygen and inactive gas, so that Grown-in defects near the surface are completely eliminated by filling with interstitial silicon atoms.

In the annealing in an oxygen ambient at this time, concern is that injected interstitial silicon atoms will suppress oxygen precipitation, however oxygen precipitates have been sufficiently grown in the bulk of the wafer because of the first annealing by a hydrogen and/or inactive gas, and the oxygen precipitates do not disappear by the next annealing in an oxygen ambient, therefore the gettering effect for heavy metal contamination by IG is expected in the device process. The concentration of oxygen precipitates can be controlled by changing the temperature at loading into the heat treatment furnace, holding time after loading, or the temperature rising speed.

The above mentioned hydrogen reduction RTA method is characterized in that RTA is used for suppressing the growth of oxide films on the inner walls at temperature rising time utilizing the reduction action of hydrogen, and in order to generate small octahedral voids and to make the oxide films on the inner walls thinner, crystals with a low oxygen concentration which were pulled at high-speed by the CZ method are necessary.

The present invention, on the other hand, dissolves the oxide films on the inner walls of the Grown-in defects in the areas where oxygen is unsaturated, utilizing the out-diffusion of oxygen caused by annealing in a hydrogen and/or inactive gas ambient, that is, the out-diffusion of oxygen which is more outstanding than that in annealing in an oxygen ambient, therefore the present invention is theoretically different from the hydrogen reduction RTA method, and has an advantage in that the target wafers are not restricted by properties.

In the case of the hydrogen reduction RTA method which eliminates Grown-in defects by supplying interstitial silicon atoms from the wafer surface in a thermal equilibrium state, areas on the surface where Grown-in defects do not exist are at most 0.2 $\mu$m deep, but the method in accordance with the present invention has an advantage in that the obtained wafer has a Grown-in defect free area down to 10 μm from the surface since interstitial silicon atoms are intentionally injected by thermal oxidation in a non-equilibrium state, where a far more number of interstitial silicon atoms exist than in an equilibrium state.

In the present invention, if the minimum temperature of the first annealing in a hydrogen and/or inactive gas ambient is less than 1000° C., the oxide films on the inner walls of the octahedral voids cannot be completely removed or a lengthy heat treatment is required, therefore 1000° C. or more is preferable, and if the maximum temperature exceeds 1350° C., it is very difficult to prevent slip and metal contamination problems from occurring, therefore 1350° C. or less is preferable. An even more preferable temperature range is 1150° C. to 1250° C.

The annealing in a hydrogen and/or inactive gas ambient requires about 50 hours at 1000° C. to dissolve the oxide films on the inner walls of the octahedral voids. It is preferable to perform the first high temperature annealing at a temperature range of around 1200° C. for one hour to four hours.

The next oxidation annealing requires 800° C. or more to inject sufficient interstitial silicon atoms by thermal oxidation, and the upper limit temperature should be 1350° C. or less because of the above mentioned slip and metal contamination problems. An even more preferable temperature range is from 1150° C. to 1250° C.

The oxidation annealing requires about 50 hours at 800° C. to eliminate the Grown-in defects where oxide films on the inner walls have been removed. It is preferable to perform annealing for one to two hours at around a 1200° C. temperature range.

As described above, the semiconductor silicon wafer fabrication method in accordance with the present invention is characterized in that in a silicon wafer fabrication process, a semiconductor silicon wafer sliced from single-crystal silicon by the CZ method is first annealed in a hydrogen and/or inactive gas ambient to remove the oxide films on the inner walls of the void defects (Grown-in defects) from the surface to a prescribed depth, then an oxidation annealing is performed to forcibly inject interstitial silicon atoms, so that the speed of eliminating the defects near the surface is accelerated to eliminate the Grown-in defects, and the following fabrication methods under various conditions can be used depending on the characteristics of the target wafer.

1) Voids are completely eliminated from the surface to a prescribed depth, and oxygen precipitates are generated in the bulk of the wafer at the same time to add the IG effect, 2) the concentration of oxygen precipitates is controlled by changing the temperature at loading into the furnace, holding time after loading or temperature rising speed, 3) annealing in a hydrogen and/or inactive gas ambient is performed for 50 hours or less at a 1000° C. or more and 1350° C. or less temperature range, and an oxidation annealing is performed for 50 hours or less at a 800° C. or more and 1350 or less temperature range, 4) a temperature range of each annealing is 1150° C. to 1250° C. and treatment time is one hour to four hours, 5) after an annealing by a hydrogen or mixed gas of hydrogen and inactive gas, inactive gas is supplied to sufficiently decrease hydrogen gas concentration, then an oxidation annealing is continuously performed, 6) in the case of an annealing in an inactive gas ambient, an oxidation annealing is continuously performed immediately after the above annealing, 7) the wafer is unloaded from the heat treatment furnace after an annealing in a hydrogen and/or inactive gas ambient, then an oxidation annealing is performed, 8) the treatment target wafer is a cleaned wafer, a mirror-polished final wafer after naturally removing the oxide films by hydrogen fluoride cleaning or another means, or a wafer before final mirror polishing, 9) a wafer before final polishing is annealed, oxide film is removed, and mirror polishing is performed, 10) after annealing, a final wafer mirror polishing is performed, 11) the final polishing depth on one or both sides of a wafer after annealing is 0.1 μm~10 μm, 12) the final polishing depth of a wafer is 0.5 μm~2 μm, 13) a treatment target wafer is a wafer on which oxide film has been grown in advance before loading for annealing, and 14) the thickness of the oxide film is 50 nm or less.

The semiconductor silicon wafer of the present invention which is obtained by the above fabrication methods is a single-crystal silicon wafer by the CZ method, characterized in that the interstitial silicon atoms are forcibly injected from the wafer surface and COP and Grown-in defects are completely eliminated from the surface to the prescribed depth by annealing in a hydrogen and/or inactive gas ambient first and then annealing in an oxidation ambient.

As an application of this invention, a wafer in accordance with this invention can be glued as the active side substrate of an SOI substrate, and in this case, the active side substrate where oxide films with the desired thickness were grown during the oxidation of this invention may be glued with the support substrate, or the active side substrate from which oxide films were removed after the annealing of this invention may be glued with the support substrate where oxide films with the desired thickness were grown, or it is also possible that oxide film removal and second mirror polishing processes are added after the annealing of this invention, oxide films with the desired thickness are grown on this substrate or on the support substrate, and then the substrates are glued together.

The wafer in accordance with this invention can be used as a substrate for epitaxial growth. When a thin epitaxial film is grown on a conventional substrate, COP on the surface affects the epitaxial growth film, but the substrate in accordance with this invention can prevent such a problem.

Embodiments

Embodiment 1

Using final mirror-polished wafers with a 150 mm outer diameter which were sliced from boron-doped single-crystal silicon ingots grown by the CZ method and which have an oriented <100 > and initial oxygen concentration of 14.5× $10^{17}$ atoms/cm$^3$ (old ASTM) characteristics, we fabricated comparison wafers (a) which are the above wafers annealed in a hydrogen ambient for one hour at 1200° C., and wafers (b) of this invention which are the above wafers annealed in a hydrogen ambient for one hour at 1200° C., then unloaded from the furnace once, and then annealed in a dry oxygen ambient for one hour at 1200° C.

On the surface of the two types of fabricated wafers, 1 μm, 3 μm, 5 μm and 10 μm mirror polishing was performed again, SC-1 cleaning was repeated six times, then the distribution of LPD (Light Point Defects) on the surface was measured by laser plane inspection equipment, and FIG. 1 shows the result.

In the case of hydrogen annealing only, as the black dots in FIG. 1 show, the number of LDPs increases as depth from the wafer surface increases. In the case of the annealing of this invention, as the white circles show, LPDs are not observed even at a 6 μm depth from the surface. Therefore the annealing of this invention has a remarkable LPD decreasing effect. The black rhombuses in FIG. 1 show wafers which were not annealed.

In an AFM observation of the LPDs of these wafers, considerable residue of Grown-in defects were observed in the case of hydrogen annealing only. In the case of the wafers of this invention, however, COP (pits) were not observed even at a depth of 6 μm.

For the gate oxide integrity of these wafers, characteristics deterioration was observed in a depth direction from the surface in the case of the wafer annealed only in a hydrogen ambient, but in the case of the annealed wafer of this invention, good gate oxide integrity equivalent to an epitaxial wafer was obtained from the surface to the area at 5 μm.

Embodiment 2

Figure 2A:
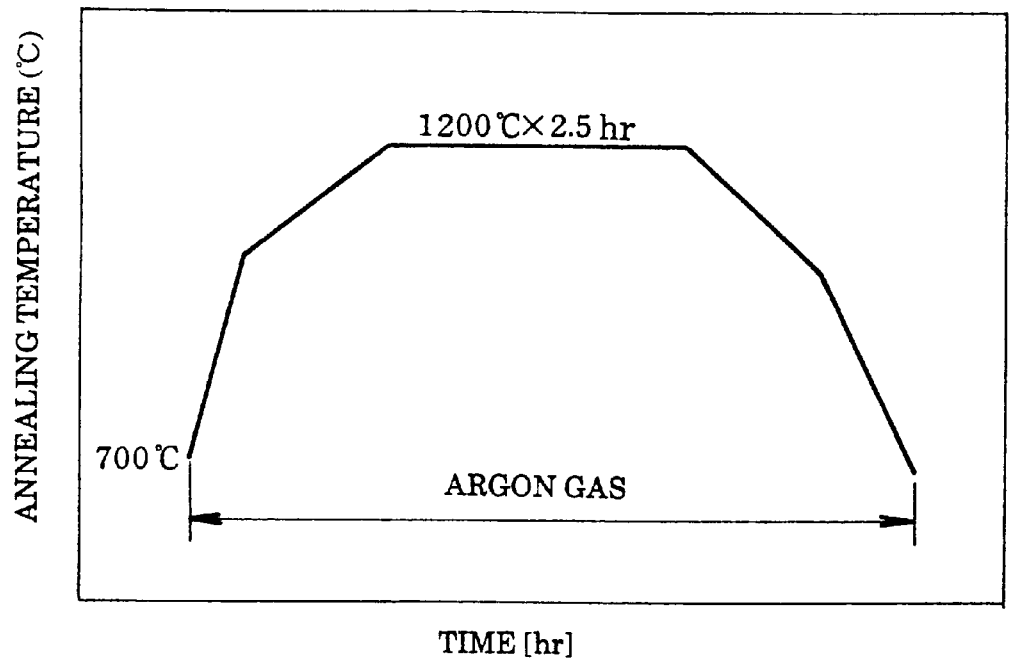
FIG. 2A and FIG. 2B are graphs depicting a relationship between treatment time and the annealing temperature of the respective embodiment.
Figure 2B:
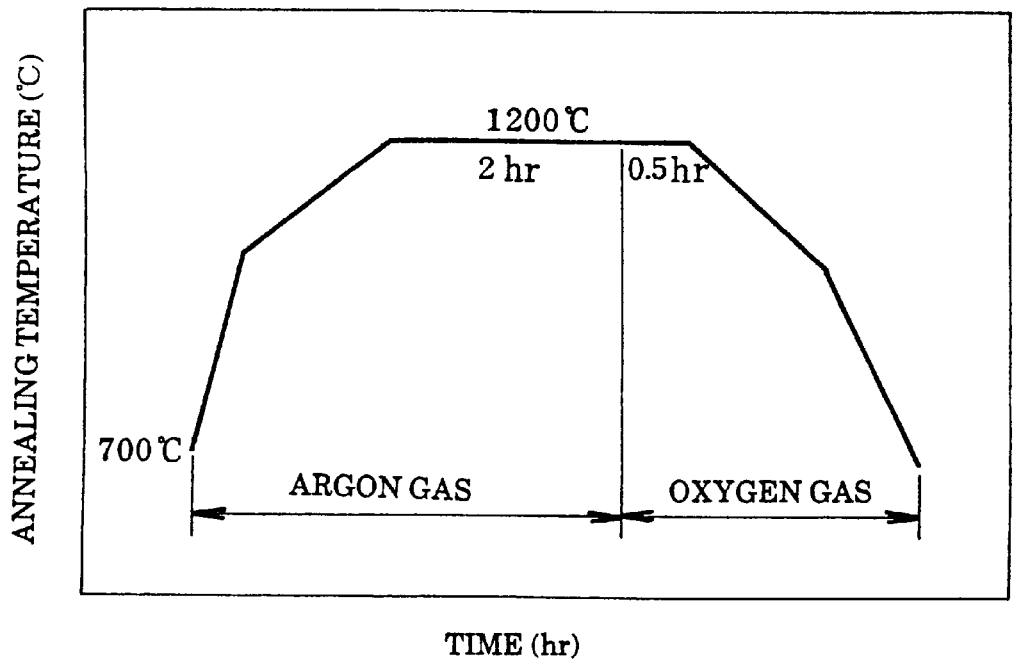

Using samples that are the same as in Embodiment 1 (initial oxygen concentration: $10.2 \sim 14.5 \times 10^{17}$ atoms/cm$^3$), the behavior of Grown-in defects in an argon ambient was examined according to the annealing sequence shown in FIG. 2. FIG. 2A is the case of an argon ambient only, and FIG. 2B is the case when an argon ambient is changed to dry oxygen in the middle of the process.

Figure 3:
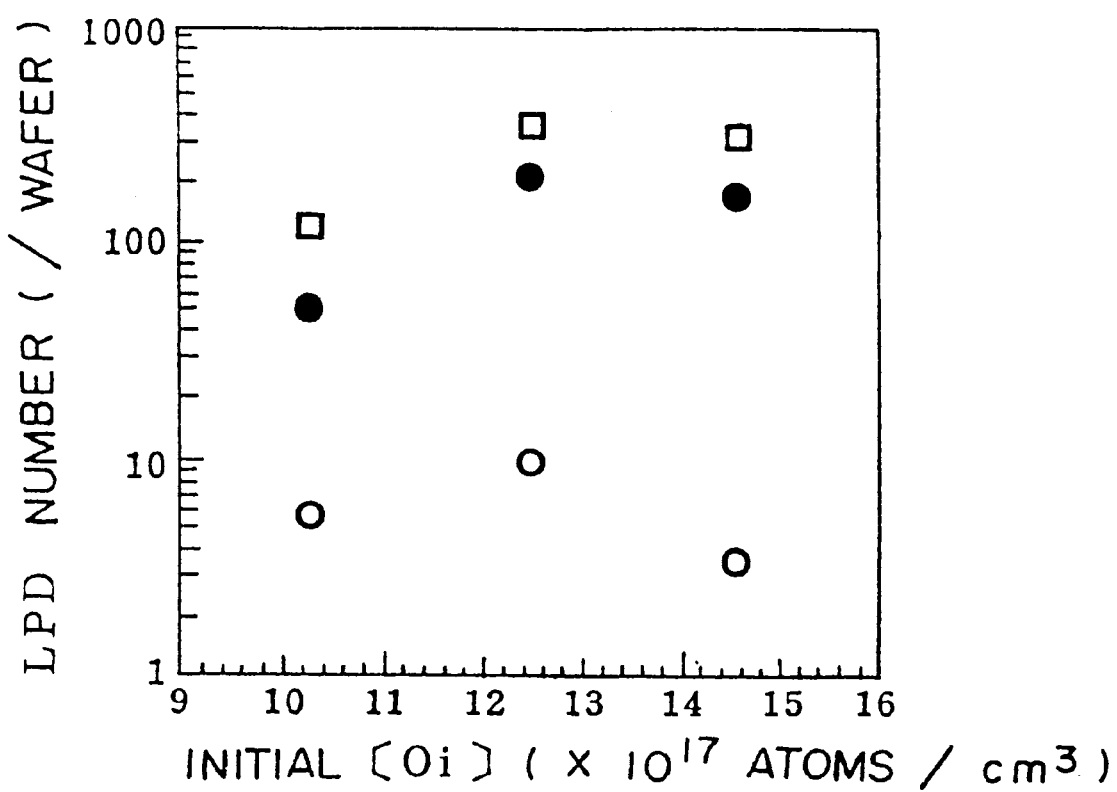
FIG. 3 is a graph depicting a relationship between initial oxygen concentration and LPD distribution on the wafer surface.

We mirror-polished the two types of created wafers again to a 3 μm from the surface, and measured the distribution of LPDs on the surface using laser plane inspection equipment. FIG. 3 shows the number of defects with a size of 0.105 μm or more detected on the wafer plane. For the wafer annealed in an argon ambient for 2.5 hours at 1200° C. (black dots), approximately 200 LPDs existed on the plane. For the wafer annealed in an argon ambient plus oxygen ambient (white circles), on the other hand, only 10 LPDs existed, which were all particles, when the result is viewed under AFM. The white squares in FIG. 3 show wafers which were not annealed.

We annealed these two types of samples in a dry oxygen ambient for 16 hours at 1000° C., cleaved the wafers then observed the concentration of oxygen precipitates in the bulk of the wafer by Wright etching. The concentration of oxygen precipitates was approximately $5 \times 10^5$ cm$^{-2}$ for both types of wafers, showing that the concentration of oxygen precipitates is not decreased by oxidation treatment.

Embodiment 3

In a heat treatment furnace with poor air tightness inside and outside the furnace due to the structure of the furnace, we performed high temperature annealing in an argon ambient for five hours at 1150° C. After confirming that many pits were generated on the wafer surface under a spotlight, oxidation annealing was continuously performed for 2.5 hours at 1150° C.

After this annealing, the wafers were mirror-polished for 0.5 μm, 1 μm and 2 μm depths from the surfaces respectively, the surface of the wafers were checked again under a spotlight, and the pits were completely removed. We evaluated gate oxide integrity of these samples and confirmed that no gate oxide integrity deterioration occurred even at 2 μm polishing.

Embodiment 4

Samples the same as in Embodiment 1 were loaded into the furnace under two conditions, loading at 700° C. and at 800° C., the temperature was raised up to 1200° C. and held for one hour, then the ambient was switched to dry oxygen and held for one hour. After the annealing ended, we annealed these samples in a dry oxygen ambient for 16 hours at 1000° C., then cleaved and measured the concentration of oxygen precipitates of the bulk of the wafer by Wright etching.

For the sample loaded at 700° C., the concentration of oxygen precipitates was $4 \sim 6 \times 10^5$ cm$^{-2}$, and for the sample loaded at 800° C., the concentration of oxygen precipitates was $0.3 \sim 1 \times 10^5$ cm$^{-2}$, therefore the concentration of oxygen precipitates can be controlled by changing the temperature at loading.

Also samples the same as in Embodiment 1 were loaded into the furnace at 700° C., held for 30 minutes, then the temperature was raised up to 1200° C. and held for one hour, then the ambient was switched to dry oxygen and held for one hour. The annealed samples were annealed as above for evaluation, and the concentration of oxygen precipitates was measured. The concentration of this sample was $8 \times 10^5$ cm$^{-2}$.

Embodiment 5

Figure 4:
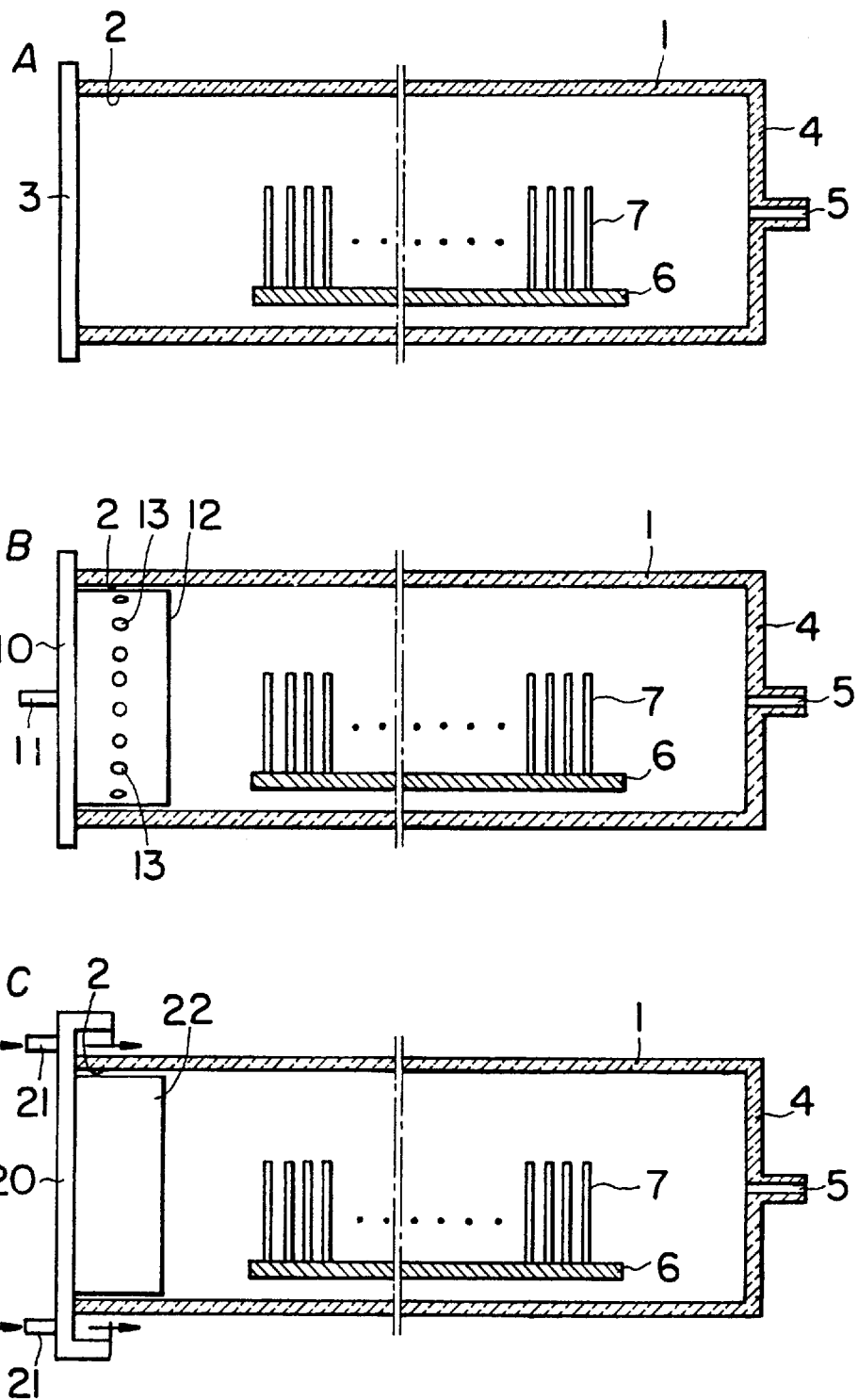
FIG. 4A is a longitudinal section of a conventional horizontal diffusion furnace.
FIG. 4B and FIG. 4C are longitudinal sections of a horizontal diffusion furnace in accordance with the present invention.

In the ordinary soft landing type horizontal diffusion furnace shown in FIG. 4A, where the cap 3 is set at the furnace entry 2 at the open end of the reaction tube 1, and ambient gas is supplied from gas inlet 5 of the other closed end 4, 120 wafers 7 are set on the boat 6 inserted in the tube 1, and are annealed in an argon gas ambient for 3.5 hours at 1150° C.

We sampled the 10th, 60th and 110th wafers of the annealed wafers from the furnace entry side, and measured the thickness of thermal oxide film grown on the surface using an ellipsometer. The thickness was 21 nm for the 10th wafer, 15 nm for the 60th wafer, and 14 nm for the 110th wafer, and it is clear that oxygen mixed in from the furnace entry because oxide film thickness near the furnace entry is thicker.

The rest of the wafers were divided into two groups. For one group, mirror polishing was performed to a 2 μm depth from the surface, LPD measurement was performed by laser plane inspection equipment, then AFM observation was performed. Compared with the oxide film thickness on the inner walls of Grown-in defects of wafers which were not annealed, we confirmed that the thickness of oxide films on the inner walls of the Grown-in defects of the present invention increased.

For the wafers of the other group, annealing was performed in a 100% oxygen ambient for two hours at 1150° C., the above processing was performed, then AFM observation was performed. The oxide film thickness on the inner walls of the Grown-in defects had further increased, completely filling the voids with oxide films.

Embodiment 6

An embodiment where a horizontal diffusion furnace is used and a device with a simple remodeled structure having a gas purge structure and a furnace insertion buffer is used for the cap of the furnace entry is shown next. In the furnace structure shown in FIG. 4B, the cap 10 used for the furnace entry 2 has a gas inlet 11 for purging to the outside and has gas purge holes 13 at the prescribed thickness of the buffer layer 12, and the example shown in FIG. 4C has gas inlets 21 for purging at the periphery of the cap 20 which is located at the periphery of the furnace entry 2 at the open end of the reaction tube 1, and prescribed thickness of the buffer layer 22.

In the horizontal diffusion furnace using the above configuration of caps 10 and 20, 120 wafers were set and annealed in an argon ambient. After heat treatment, the thermal oxide film thickness on the wafer surfaces was measured. The oxide film thickness was 2 nm for all 10th, 60th and 110th wafers from the furnace entry 2. Since the initial natural oxide film thickness is about 1 nm, the oxide film was grown at unloading wafers, and oxide film growth by air that enters into the furnace during annealing processes can be prevented.

We mirror-polished these samples to 2 μm deep from the surface and then performed AFM observation, and found that the oxide films on the inner walls of the Grown-in defects were completely eliminated. We also performed annealing in a 100% oxygen ambient for two hours at 1150° C., and then performed AFM observation. We again confirmed that Grown-in defects were completely eliminated.

As the above embodiments show, the silicon wafer in accordance with this invention can completely eliminate defects and improve device characteristics because the residue of COP defects near the surface after annealing in a hydrogen and/or inactive gas is annealed in oxygen alone, or a mixed gas of oxygen and inactive gas, or in an oxidation ambient combined with water vapor, so that interstitial silicon atoms are forcibly injected from the wafer surface and efficiently fill the Grown-in defects near the surface, which makes it possible to almost completely eliminate Grown-in defects, which conventional annealing only in such inactive gas ambients as hydrogen and argon could not, for about 10 $\mu$m from the surface, and to obtain semiconductor silicon wafers with good characteristics equivalent to epitaxial wafers at low cost. With the wafers annealed in according with this invention, oxygen precipitates sufficient for gettering of heavy metals in the bulk of wafers are formed, therefore the IG effect can be expected.

What is claimed is:

1. A semiconductor silicon wafer fabrication method for eliminating Grown-in defects in silicon wafer fabrication process by annealing a silicon wafer obtained from single-crystal silicon grown by the Czochralski method in an ambient of hydrogen, inactive gas, or hydrogen and inactive gas to remove oxide films on the inner walls of void defects (Grown-in defects) from the surface to a prescribed depth, then performing oxidation annealing to forcibly inject interstitial silicon atoms.

2. The semiconductor silicon wafer fabrication method according to claim 1, wherein voids are completely eliminated from the surface to a prescribed depth, and the IG (Intrinsic Gettering) effect is added by oxygen precipitates generated in bulk of the wafer.

3. The semiconductor silicon wafer fabrication method according to claim 1 or claim 2, wherein the concentration of oxygen precipitates is controlled by changing temperature at loading to the furnace, holding time after loading or temperature rising speed.

4. The semiconductor silicon wafer fabrication method according to claim 3, wherein the annealing in an ambient hydrogen, inactive gas, or hydrogen and inactive gas is annealing for 50 hours or less at a temperature of 1000° C. or higher and 1350° C. or lower, and the oxidation annealing is annealing for 50 hours or less at a temperature of 800° C. or higher and 1350° C. or lower.

5. The semiconductor silicon wafer fabrication method according to claim 4, wherein the temperature range in each annealing is 1150° C. to 1250° C., and treatment time is one hour to four hours.

6. The semiconductor silicon wafer fabrication method according to claim 1 or claim 2, wherein the annealing in an ambient hydrogen, inactive gas, or hydrogen and inactive gas is annealing for 50 hours or less at a temperature of 1000° C. or higher and 1350° C. or lower, and the oxidation annealing is annealing for 50 hours or less at a temperature of 800° C. or higher and 1350° C. or lower.

7. The semiconductor silicon wafer fabrication method according to claim 6, wherein the temperature range in each annealing is 1150° C. to 1250° C., and treatment time is one hour to four hours.

8. The semiconductor silicon wafer fabrication method according to claim 1 or claim 2, wherein inactive gas is supplied after annealing in hydrogen or mixed gas of hydrogen and inactive gas to sufficiently decrease the concentration of hydrogen gas, then oxidation annealing is continuously performed.

9. The semiconductor silicon wafer fabrication method according to claim 1 or claim 2, wherein if annealing in an inactive gas ambient is performed, oxidation annealing is continuously performed immediately after the annealing.

10. The semiconductor silicon wafer fabrication method according to claim 1 or claim 2, wherein the wafer annealed in an ambient hydrogen, inactive gas, or hydrogen and inactive gas is unloaded from the heat treatment furnace, then oxidation annealing is performed.

11. The semiconductor silicon wafer fabrication method according to claim 1 or claim 2, wherein the treatment target wafer is a wafer after cleaning, a final mirror-polished wafer after removing natural oxide film by hydrogen fluoride cleaning or another means, or a wafer before final mirror polishing.

12. The semiconductor silicon wafer fabrication method according to claim 11, wherein a wafer before final polishing is annealed, oxide films of the wafer are removed, then fine mirror polishing is performed.

13. The semiconductor silicon wafer fabrication method according to claim 11, wherein a wafer after final polishing is annealed, and then mirror polishing is performed.

14. The semiconductor silicon wafer fabrication method according to claim 12, wherein the final polishing depth on one side or both sides of the wafer after annealing is 0.1 $\mu$m~10 $\mu$m.

15. The semiconductor silicon wafer fabrication method according to claim 14, wherein the final polishing depth of the wafer is 0.5 $\mu$m~2 $\mu$m.

16. The semiconductor silicon wafer fabrication method according to claim 13, wherein the final polishing depth on one side or both sides of the wafer after annealing is 0.1 $\mu$m~10 $\mu$m.

17. The semiconductor silicon wafer fabrication method according to claim 1 or claim 2, wherein the treatment target wafer is a wafer where oxide film is grown in advance before loading for annealing.

18. The semiconductor silicon wafer fabrication method according to claim 17, wherein thickness of the oxide film is 50 nm or less.

19. An annealing equipment for annealing used in the semiconductor silicon wafer fabrication method according to claim 1 or claim 2, wherein a diffusion heat treatment furnace comprises a gas purge mechanism and a furnace insertion buffer at a cap of the furnace entry for preventing oxygen and moisture in the air from mixing into the furnace.

20. The semiconductor silicon wafer fabrication method according to claim 6, wherein inactive gas is supplied after annealing in hydrogen or mixed gas of hydrogen and inactive gas to sufficiently decrease the concentration of hydrogen gas, then oxidation annealing is continuously performed.

21. The semiconductor silicon wafer fabrication method according to claim 6, wherein if annealing in an inactive gas ambient is performed, oxidation annealing is continuously performed immediately after the annealing.

22. The semiconductor silicon wafer fabrication method according to claim 6, wherein the wafer annealed in an ambient hydrogen, inactive gas, or hydrogen and inactive gas is unloaded from the heat treatment furnace, then oxidation annealing is performed.

23. The semiconductor silicon wafer fabrication method according to claim 22, wherein the final polishing depth of the wafer is 0.5 $\mu$m~2 $\mu$m.

24. An annealing equipment for annealing used in the semiconductor silicon wafer fabrication method according to claim 6, wherein a diffusion heat treatment furnace comprises a gas purge mechanism and a furnace insertion buffer at a cap of the furnace entry for preventing oxygen and moisture in the air from mixing into the furnace.

* * * * *